(12) United States Patent
Cheng

(10) Patent No.: US 7,772,703 B2
(45) Date of Patent: Aug. 10, 2010

(54) PACKAGE SUBSTRATE

(75) Inventor: David C. H. Cheng, Taoyuan County (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 11/533,765

(22) Filed: Sep. 20, 2006

(65) Prior Publication Data
US 2008/0036058 A1 Feb. 14, 2008

(30) Foreign Application Priority Data
Aug. 9, 2006 (TW) .............................. 95129187 A

(51) Int. Cl.
*H01L 23/538* (2006.01)
(52) U.S. Cl. ................. 257/758; 257/774; 257/E23.011
(58) Field of Classification Search ................. 257/750, 257/758, 774, 738, E23.011; 361/748
See application file for complete search history.

(56) References Cited

U.S. PATENT DOCUMENTS

| 4,689,442 A * | 8/1987 | Ozaki .......................... 174/266 |
| 6,960,824 B1 * | 11/2005 | Hashemi et al. ............... 257/698 |
| 2003/0002260 A1 * | 1/2003 | Hasebe et al. ................. 361/720 |
| 2003/0173331 A1 | 9/2003 | Tsai et al. |
| 2004/0074088 A1 * | 4/2004 | Nakamura et al. ............. 29/831 |
| 2005/0145413 A1 * | 7/2005 | Chang et al. .................. 174/250 |

FOREIGN PATENT DOCUMENTS

| JP | 2000-003980 | 1/2000 |
| JP | 2004-31738 | 1/2004 |
| JP | 2006-73777 | 3/2006 |

* cited by examiner

*Primary Examiner*—Lynne A Gurley
*Assistant Examiner*—Colleen A Matthews
(74) *Attorney, Agent, or Firm*—Jianq Chyun IP Office

(57) ABSTRACT

A package substrate including a circuit board, a reinforcing plate and at least one conductive channel is provided. A first surface of the reinforcing plate is disposed on the circuit board for resisting the warpage of the circuit board. The reinforcing plate has an opening corresponding to a first contact of the circuit board exposed thereon. In addition, one end of the conductive channel is located in the opening and electrically connected to the first contact, and the other end of the conductive channel is located on a second surface of the reinforcing plate to form a bonding pad.

20 Claims, 2 Drawing Sheets

PACKAGE SUBSTRATE

CROSS-REFERENCE TO RELATED APPLICATION

This application claims the priority benefit of Taiwan application serial no. 95129187, filed Aug. 9, 2006. All disclosure of the Taiwan application is incorporated herein by reference.

BACKGROUND OF THE INVENTION

1. Field of Invention

The present invention relates to a package substrate, and more particularly, to a package substrate in which the structural strength of a thin circuit board is reinforced.

2. Description of Related Art

In recent years, as the rapid progress of the electronic technology, high-tech electronic products have been developed, thus human-oriented electronic products with preferred performance have brought forth a new era, and have been designed to cater to the trend of being light, thin, short, and small.

Referring to FIG. 1, FIG. 1 is a schematic view of a conventional package substrate. To enhance the strength of a package substrate 100, a copper foil substrate 120 with a core layer 110 containing glass fiber and epoxy resin is used to fabricate the inner circuit of the package substrate 100. The thickness of the copper foil substrate falls within a range of 400-800 µm, and desirable circuit layers 122, 124 are formed on two opposite surfaces of the copper foil substrate through a patterned etching process. However, although the copper foil substrate 120 with a greater thickness is useful for enhancing the strength and supportability of the package substrate 100, the electrical transmission speed of the circuit layers 122 and 124 is reduced accordingly. Therefore, in order to meet the requirements of a thin substrate, the thickness of the core layer 110 in the conventional package substrate 100 has to be reduced, so as to accelerate the transmission of electronic signals.

However, as the thickness of the thin substrate is reduced, it cannot provide adequate supportability to meet the flatness requirements. Particularly, during the bumping process in a high-temperature environment, as the thin substrate is heated, the warpage of the thin substrate becomes even serious, which cannot meet the requirements of the manufacturing process.

SUMMARY OF THE INVENTION

An objective of the present invention is to provide a package substrate, in which the strength of a thin substrate is enhanced by combining a reinforcing plate, so as to meet the requirements of the manufacturing process.

The present invention provides a package substrate, which comprises a circuit board, a reinforcing plate and at least one conductive channel. A first surface of the reinforcing plate is disposed on the circuit board for resisting the warpage of the circuit board. The reinforcing plate has an opening corresponding to a first contact of the circuit board exposed thereon. In addition, one end of the conductive channel is located in the opening and electrically connected to the first contact, and the other end of the conductive channel is located on a second surface of the reinforcing plate to form a bonding pad.

According to an embodiment of the present invention, the circuit board is a coreless circuit board, having an insulating layer with a thickness of less than 60 µm. The circuit board further has an upper circuit, a lower circuit and a plated through hole. The upper circuit and the lower circuit are disposed on two opposite surfaces of the insulating layer, and the plated through hole penetrates through the two opposite surfaces of the insulating layer and is electrically connected to the upper circuit and the lower circuit. The circuit board further has an upper insulating layer, a lower insulating layer and conductive vias. The upper insulating layer covers the upper circuit, the lower insulating layer covers the lower circuit, and the conductive vias are formed in the upper insulating layer and the lower insulating layer respectively and are electrically connected to the upper circuit and the lower circuit.

According to the aforementioned embodiment of the present invention, the first contact is located between the lower insulating layer and the reinforcing plate, and the conductive vias are electrically connected to each conductive channel via the first contact.

According to an embodiment of the present invention, the reinforcing plate comprises an insulating film and a metal plate, and the surfaces of the metal plate are covered by the insulating film. The metal plate is made of a metal, such as copper, aluminum, or stainless steel. The insulating film is made of an insulating material, such as epoxy resin or polyimide.

The reinforcing plate is used in the present invention to enhance the strength of the thin circuit board, and the reinforcing plate is unlikely to warp under a high temperature, thus the present invention eliminates the warpage of the thin circuit board during the bumping process in a high-temperature environment, so as to meet the requirements of the manufacturing process.

In order to make the aforementioned and other objects, features and advantages of the present invention comprehensible, preferred embodiments accompanied with figures are described in detail below.

DESCRIPTION OF EMBODIMENTS

Figure 1:
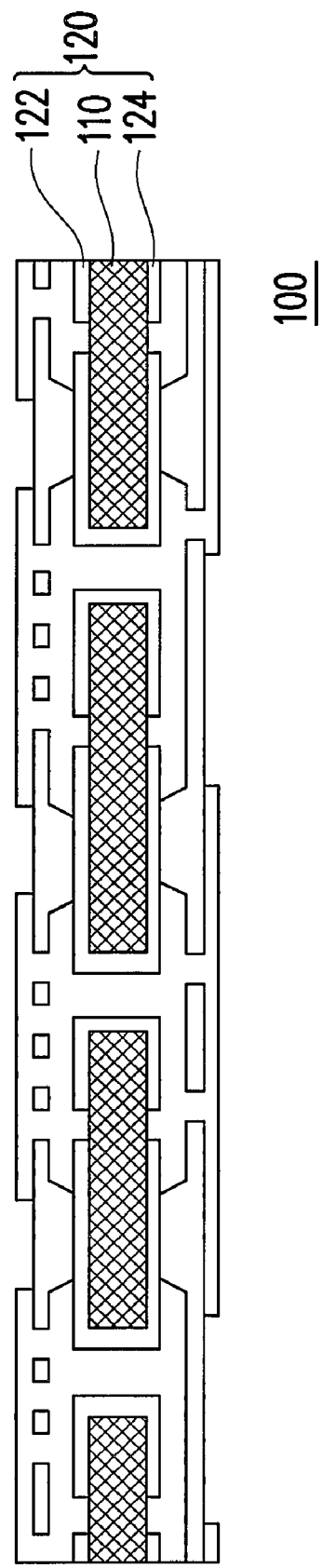
FIG. 1 is a schematic view of a conventional package substrate.
Figure 2:
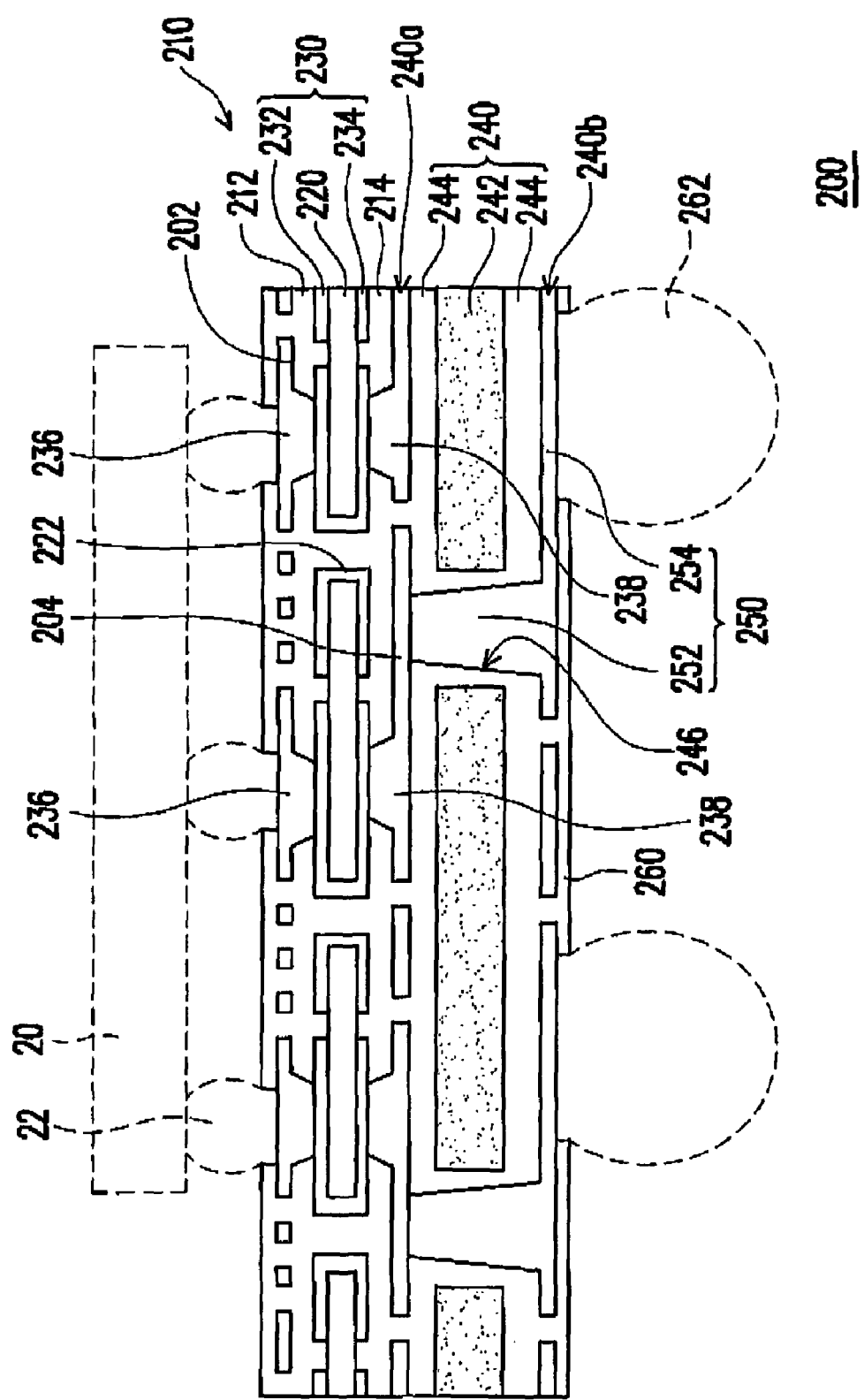
FIG. 2 is a schematic view of a package substrate according to an embodiment of the present invention.

Referring to FIG. 2, FIG. 2 is a schematic view of a package substrate according to an embodiment of the present invention. The package substrate 200 includes a circuit board 210, which meets the circuit density and thickness limit requirements of a thin substrate, so as to accelerate the transmission of electronic signals. The circuit board 210 has a plurality of upper contacts 202 (i.e., the second contacts), which are correspondingly connected to bumps 22 on a chip 20 (indicated by dashed lines) to transmit the electronic signals. In particular, an inner circuit 230 of the present invention is fabricated by an insulating layer 220 of no glass fiber and by two metal layers formed on two surfaces of the insulating layer 220. The inner circuit 230 includes an upper circuit 232 and a lower circuit 234, which are electrically connected via plated through holes 222 penetrating through the insulating layer 220. The thickness of the insulating layer 220 is less than 100 µm, and is preferably between 50 µm and 60 µm. Therefore, the circuit board 210 is thinner than the conventional core layer 110 of FIG. 1 containing glass fiber.

In FIG. 2, the circuit board 210 further has an upper insulating layer 212 and a lower insulating layer 214. The upper insulating layer 212 covers the upper circuit 232, and the lower insulating layer 214 covers the lower circuit 234. The upper insulating layer 212 and the lower insulating layer 214 have the thickness of approximately 50-60 μm, and they are formed as the multi-layered circuit board 210 through the build-up process or they are stacked to form as the multi-layered circuit board 210 through the laminating process. The upper circuit 232 and the lower circuit 234 can be electrically connected to the corresponding upper contact 202 or lower contact 204 (i.e., the first contact) through conductive vias 236 and 238 respectively. The conductive vias 236 and 238 are respectively formed in the upper insulating layer 212 and the lower insulating layer 214 through metal electroplating process or conductive bump puncturing process, for example.

It should be noted that, as the circuit board 210 is relatively thin, the strength is inadequate. To enhance the strength of the circuit board 210, the package substrate 200 of the present invention further includes a reinforcing plate 240, and a first surface 240a of the reinforcing plate 240 is disposed on the circuit board 210. In this embodiment, the reinforcing plate 240 is disposed below the circuit board 210. However, in another embodiment, the reinforcing plate 240 is, for example, disposed above the circuit board 210.

The reinforcing plate 240 can be fixed on the fabricated circuit board 210 by way of laminating, so as to provide the required strength to the circuit board 210, and thereby enhancing the flatness of the circuit board 210, so as to meet the requirements of the manufacturing process. In this embodiment, the reinforcing plate 240 includes a metal plate 242 with adequate strength and an insulating film 244 for covering the surface of the metal plate 242. The metal plate 242 is made of, for example, a metal such as copper, aluminum, or stainless steel. Another objective of using the metal plate 242 is to enlarge the heat dissipation area, so as to enhance the heat dissipation efficiency of the package substrate 200, and to prevent the interference of electromagnetic waves by way of metal shielding. In addition, the insulating film 244 can prevent short circuits caused by mis-contact between the metal plate 242 and the circuit board 210. The insulating layer 244 is made of, for example, an insulating material such as epoxy resin or polyimide.

It should be noted that, the package substrate 200 of the present invention further has one or more conductive channels 250. One end 252 of each conductive channel 250 is located in the opening 246, and is electrically connected to the lower contact 204 of the circuit board 210. The conductive channel 250 is fabricated as follows. Firstly, at least an opening 246 is formed on the reinforcing plate 240 by way of mechanical or laser drilling, and the insulating film 244 is used to cover the inner wall of the opening 246. Next, the reinforcing plate 240 is pressed and fixed on the circuit board 210, and the lower contact 204 of the circuit board 210 is exposed on the opening 246 correspondingly. Then, a metal layer is formed in the opening 246 and on a second surface 240b of the reinforcing plate 240 through an electroplating process. Finally, the metal layer is patterned to form the desirable conductive channel 250. In this embodiment, the other end of the conductive channel 250 is located on the second surface 240b of the reinforcing plate 240 to form a bonding pad 254, and the bonding pad 254 is exposed by a solder mask 260, which is used to cover the second surface 240b of the reinforcing plate 240, so as to be electrically connected to a solder ball 262 (indicated by dashed lines) or a pin (not shown).

In view of the above, as the reinforcing plate 240 is made of a high-temperature resistant material and is not easy to warp, the warpage of the circuit board 210 occurred during the bumping process in a high-temperature environment can be prevented, so as to meet the flatness requirements.

To sum up, the reinforcing plate is used in the present invention to enhance the strength of the thin circuit board, and the reinforcing plate is not easily warped under a high temperature, thus, the present invention eliminates the warpage of the thin circuit board during the high-temperature bumping process, so as to meet the requirements of the manufacturing process. Moreover, the reinforcing plate has a larger heat dissipation area and higher heat dissipation efficiency, and has the effect of metal shielding to prevent the interference of electromagnetic waves.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package substrate, comprising:
   a circuit board;
   a reinforcing plate, wherein the reinforcing plate comprises a first surface and a second surface and
   the first surface of the reinforcing plate extends substantially throughout the circuit board to resist warpage of the circuit board, and the reinforcing plate has an opening corresponding to a first contact of the circuit board exposed in the opening, and
   wherein the reinforcing plate comprises an insulating film on the first surface and the second surface and a metal plate, the metal plate is a single plate, and all the surfaces of the metal plate are entirely covered by the insulating film so that no electrical contact exist between the metal plate and the circuit board; and
   at least one conductive channel, passing through the metal plate with one end being located in the opening and electrically connected to the first contact, and with the other end being located on the second surface of the reinforcing plate to form a bonding pad, wherein the bonding pad is positioned at a periphery of the opening.

2. The package plate as claimed in claim 1, wherein the metal plate is made of copper, aluminum or stainless steel.

3. The package plate as claimed in claim 1, wherein the insulating film is made of epoxy resin or polyimide.

4. The package plate as claimed in claim 1, further comprising a solder mask for covering the conductive channel located on the second surface of the reinforcing plate, and exposing the bonding pad.

5. The package plate as claimed in claim 1, further comprising at least one solder ball or a pin disposed on the bonding pad.

6. The package substrate as claimed in claim 1, wherein the circuit board has an insulting layer with a thickness of less than 60 μm.

7. The package substrate as claimed in claim 6, wherein the circuit board further comprises an upper circuit, a lower circuit and a plated through hole, the upper circuit and the lower circuit are disposed on two opposite surfaces of the insulating layer, and the plated through hole penetrates through the two opposite surfaces of the insulating layer and is electrically connected to the upper circuit and the lower circuit.

8. The package substrate as claimed in claim 7, wherein the circuit board further comprises an upper insulating layer, a lower insulating layer and conductive vias, the upper insulating layer covers the upper circuit, the lower insulating layer covers the lower circuit, and the conductive vias are formed in the upper insulating layer and the lower insulating layer respectively and are electrically connected to the upper circuit and the lower circuit.

9. The package substrate as claimed in claim 8, wherein the first contact is located between the lower insulating layer and the reinforcing plate, and the conductive vias are electrically connected to the conductive channels respectively via the first contacts.

10. The package substrate as claimed in claim 8, wherein the circuit board further comprises second contacts located on a surface of the upper insulating layer, and electrically connected to the upper circuit via the conductive vias.

11. A package substrate, comprising:
a circuit board;
a reinforcing plate, wherein the reinforcing plate comprises a first surface and a second surface and
the first surface of the reinforcing plate extends substantially throughout the circuit board to resist warpage of the circuit board, and the reinforcing plate has an opening extending from the first surface to the second surface and corresponding to a first contact of the circuit board exposed in the opening, and
wherein the reinforcing plate comprises an insulating film on the first surface and the second surface and a metal plate, the metal plate is a single plate, and all the surfaces of the metal plate are entirely covered by the insulating film so that no electrical contact exist between the metal plate and the circuit board; and
at least one conductive channel, passing through the metal plate with one end being located in the opening at the first surface and electrically connected to the first contact, and with the other end being located on the second surface of the reinforcing plate to form a bonding pad wherein the bonding pad is positioned at a periphery of the opening.

12. The package plate as claimed in claim 11, wherein the metal plate is made of copper, aluminum or stainless steel.

13. The package plate as claimed in claim 11, wherein the insulating film is made of epoxy resin or polyimide.

14. The package plate as claimed in claim 11, further comprising a solder mask for covering the conductive channel located on the second surface of the reinforcing plate, and exposing the bonding pad.

15. The package plate as claimed in claim 11, further comprising at least one solder ball or a pin disposed on the bonding pad.

16. The package substrate as claimed in claim 11, wherein the circuit board has an insulting layer with a thickness of less than 60 μm.

17. The package substrate as claimed in claim 16, wherein the circuit board further comprises an upper circuit, a lower circuit and a plated through hole, the upper circuit and the lower circuit are disposed on two opposite surfaces of the insulating layer, and the plated through hole penetrates through the two opposite surfaces of the insulating layer and is electrically connected to the upper circuit and the lower circuit.

18. The package substrate as claimed in claim 17, wherein the circuit board further comprises an upper insulating layer, a lower insulating layer and conductive vias, the upper insulating layer covers the upper circuit, the lower insulating layer covers the lower circuit, and the conductive vias are formed in the upper insulating layer and the lower insulating layer respectively and are electrically connected to the upper circuit and the lower circuit.

19. The package substrate as claimed in claim 18, wherein the first contact is located between the lower insulating layer and the reinforcing plate, and the conductive vias are electrically connected to the conductive channels respectively via the first contacts.

20. The package substrate as claimed in claim 18, wherein the circuit board further comprises second contacts located on a surface of the upper insulating layer, and electrically connected to the upper circuit via the conductive vias.

* * * * *